United States Patent [19]

Minuhin et al.

[11] Patent Number: 5,592,340

[45] Date of Patent: Jan. 7, 1997

[54] COMMUNICATION CHANNEL WITH ADAPTIVE ANALOG TRANSVERSAL EQUALIZER

[75] Inventors: Vadim B. Minuhin; Vladimir Kovner, both of Oklahoma City; Srinivasan Surendran, Norman, all of Okla.

[73] Assignee: Seagate Technology, Inc., Scotts Valley, Calif.

[21] Appl. No.: 309,912

[22] Filed: Sep. 21, 1994

[51] Int. Cl.[6] .............................. G11B 5/09; G11B 5/035
[52] U.S. Cl. .................................................. 360/46; 360/65
[58] Field of Search ................................ 360/31, 46, 51, 360/65; 364/724.19, 724.2, 724.16; 375/230, 13, 14, 103, 229, 232, 350, 11; 333/18, 28 R; 370/32.1; 348/614

[56] References Cited

U.S. PATENT DOCUMENTS

| | | | |
|---|---|---|---|
| 4,146,840 | 3/1979 | McRag et al. | 375/12 |
| 4,335,396 | 6/1982 | Rzeszewski | 348/614 |
| 4,346,412 | 8/1982 | Conley | 360/46 |
| 4,564,869 | 1/1986 | Baumeister | 360/46 |
| 4,799,112 | 1/1989 | Bremmer et al. | 360/31 |
| 4,894,734 | 1/1990 | Fischler et al. | 360/51 |
| 4,928,287 | 5/1990 | Tanaka | 360/65 X |
| 4,961,160 | 10/1990 | Sato et al. | 364/724.01 |
| 5,060,088 | 10/1991 | Dolivo et al. | 360/46 |
| 5,087,992 | 2/1992 | Dahandeh et al. | 360/31 |
| 5,153,875 | 10/1992 | Takatori | 370/32.1 |
| 5,220,466 | 6/1993 | Coker et al. | 360/46 |
| 5,237,464 | 8/1993 | Cronch et al. | 360/46 |
| 5,325,130 | 6/1994 | Miller et al. | 348/614 |
| 5,392,171 | 2/1995 | Kovner | 360/65 |
| 5,422,760 | 6/1995 | Abbott et al. | 360/46 |

OTHER PUBLICATIONS

Article by E. Healy entitled "Choosing the Right PRML Read Channel", Data Storage Nov./Dec. 1995, pp. 27–34.
A. Gersho, "Adaptive Equalization of Highly Dispersive Channels for Data Transmission", The Bell System Technical Journal, Jan. 1969, pp. 55–70.

"Active Filter Design Using Operational Transconductance Amplifiers: A Tutorial" by Randall L. Geiger and Edgar Sanchez–Sinencio; pp. 20–32; Mar. 1985.

"Partial–Response Signaling" by Peter Kabal and Subbarayan Pasupathy; pp. 921–934; Sep. 1975.

"Performance Evaluation Of the Disk Drive Industry's Second Generation PRML Data Channel"; See attached typed version (3 pages).

"A PRML System for Digital Magnetic Recording" by Roy D. Cideciyan, Francois Dolivo, Reto Hermann, Water Hirt and Wolfgang Schott, pp. 38–56, Jan. 1992.

"Implementation of PRML in a Rigid Disk Drive" by J. D. Coker, R. L. Galbraith, G. J. Kerwin, J. W. Rae and P. A. Ziperovich, pp. 4538–4543; Nov. 1991.

*Primary Examiner*—Andrew L. Sniezek
*Assistant Examiner*—Patrick Wamsley
*Attorney, Agent, or Firm*—Bill D. McCarthy; Edward P. Heller, III; Randall K. McCarthy

[57] ABSTRACT

An adaptive, analog filter system of a PRML [PARTIAL RESPONSE MAXIMUM LIKELIHOOD] read channel of a disc drive comprising an adaptive, analog transversal equator connected in series with an adaptive, analog prefilter. The prefilter is comprised of a plurality of serially connected, adaptive, analog filter stages having variable transfer functions determined by adaptive parameter signals received by the filter stages. The transversal equalizer is comprised of a delay circuit, comprised of a plurality of serially connected, adaptive, analog sixth order low pass filters, that is tapped to either side of each low pass filter, a plurality of analog multipliers that receive signals at the tap locations of the delay circuit, and a summing circuit that receives the outputs of the multipliers. The transfer functions of the sixth order low pass filters are continuously variable in relation to adaptive parameter signals received by the low pass filters and the gains of the multipliers are continuously variable in relation to tap weights received by the multipliers.

6 Claims, 3 Drawing Sheets

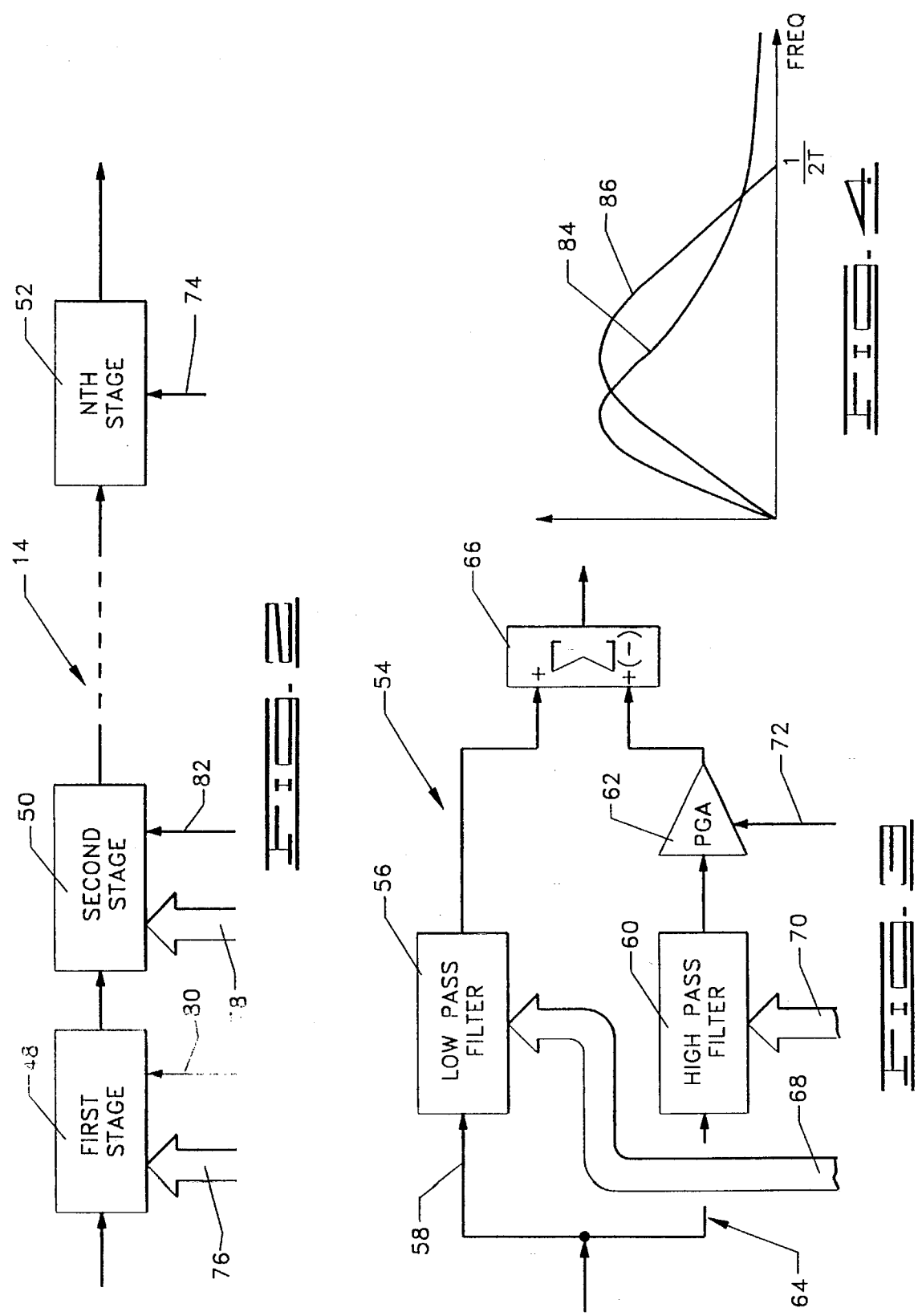

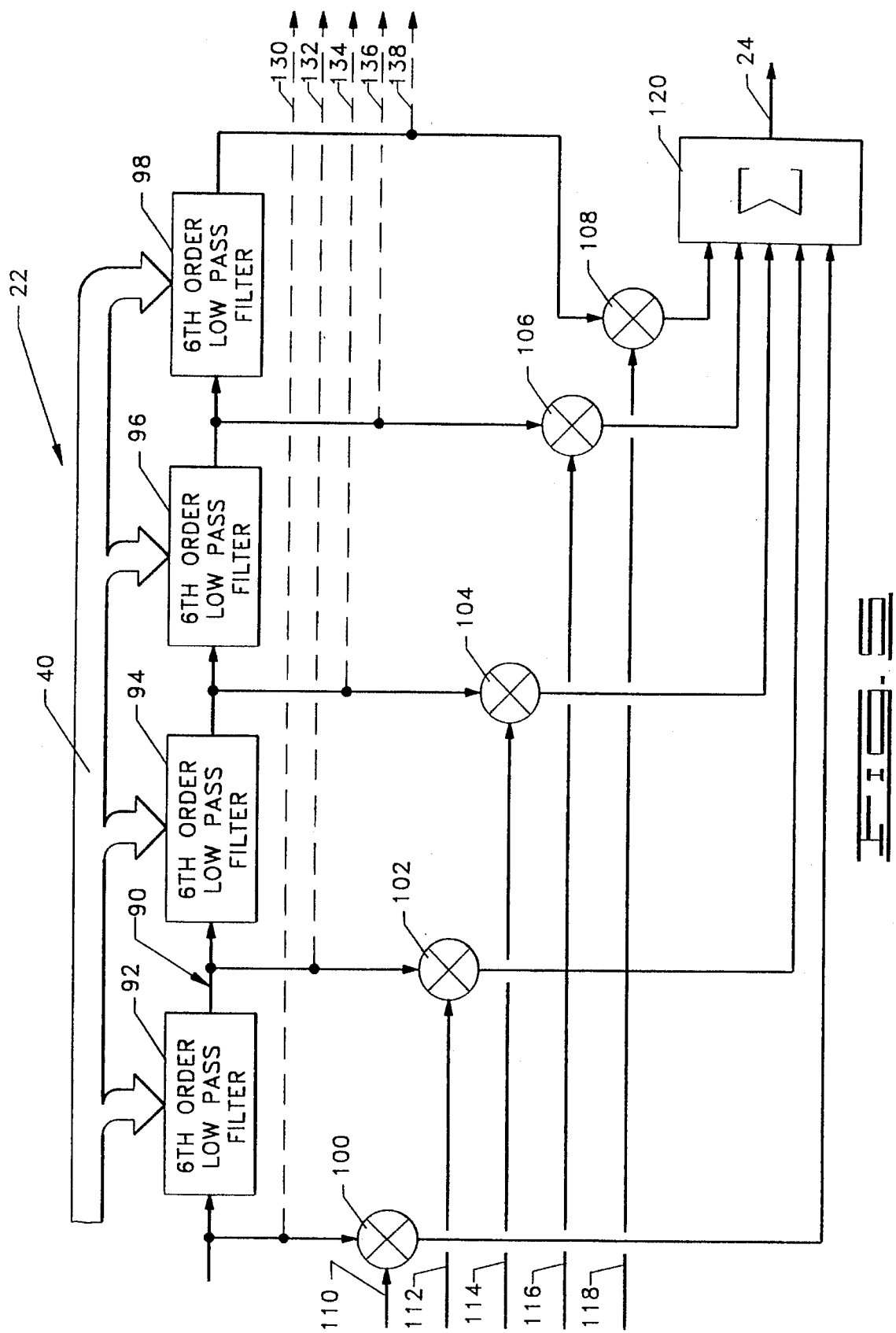

COMMUNICATION CHANNEL WITH ADAPTIVE ANALOG TRANSVERSAL EQUALIZER

BACKGROUND OF THE INVENTION

1. Field of the Invention

The present invention relates generally to improvements in electronic filters, and, more particularly, but not by way of limitation to improvements in electronic filters suitable for use in a disc drive PRML read channels.

2. Brief Description of the Prior Art

In disc drives used to store computer files, the files are stored along concentric data tracks defined in magnetizable coatings on the surfaces of rotating discs. To this end, write heads are positioned adjacent the disc surfaces and are radially movable to align with a track selected to store a file so that the track can be magnetized by passing a current through the write head. The direction in which the data track is magnetized is determined by the direction of the current through the write head so that a file can be stored by magnetizing the track in a pattern that is derived from the file. More particularly, the write head current is supplied by a write driver to which a sequence of bits derived from the file is clocked and the direction of the current in each clock period is determined by the logic values of bits received by the write driver. Consequently, successive segments of the data track will be magnetized in a pattern that reflects the contents of the file. The magnetized track segments, or data elements, in turn, produce a magnetic field that can be sensed by a read head to generate an electrical signal that varies with time in a way that reflects the sequence of data elements along the data track to permit retrieval of the file.

In a conventional disc drive, the write driver reverses the direction of the current through the write head each time a logical 1 occurs in the sequence of bits received by the write driver to, in turn, reverse the direction of magnetization of the magnetic medium along the track each time a logical 1 occurs in the sequence. During subsequent reading, each reversal in the magnetization of the data track, a so-called flux transition, gives rise to a peak in the signal generated by the read head and peak detection circuitry is used to place the peaks within "read windows" established by a phase locked loop that receives signals from the peak detection circuitry to establish a read clock that is synchronized with the passage of flux transitions by the read head. More particularly, the occurrence of a signal peak within a read window is an indicator of a flux transition along the data track. Consequently, since the flux transitions are generated by logical 1's in the encoded user file, the occurrence of a signal peak indicates a logical 1 in the sequence of data bits that were received by the write driver. The read phase locked loop is then used to clock logical 1's for those read windows in which peaks are detected, and logical 0's for those read windows in which peaks are not detected, to circuitry which regenerates the stored file.

While conventional disc drives which make use of the above scheme are able to operate reliably to store large quantities of data, it has become increasingly difficult to raise the data storage capacity of disc drives of this type to higher and higher levels that are demanded by users of disc drives. More particularly, the data storage capacity of a disc drive depends upon the transfer rate of data bits between the write head and a data track and between the data track and a read head and problems have arisen with increasing the transfer rates of drives of the generic type.

Several effects tend to limit transfer rate in conventional disc drives. The synchronization between the read clock and the passage of flux transitions by the read head depends upon the correspondence between peaks in the signal induced in the read head and passage of individual flux transitions by the read head. However, the magnetic field from which the read head signal is derived is a superposition of the magnetic fields produced by all of the flux transitions on the disc. Consequently, as the transfer rate is increased, to decrease the spacing of flux transitions along a data track, so-called "intersymbol interference"; that is, significant superposition of magnetic fields from successive flux transitions on a data track, causes peaks in the read head to be shifted in time from the times that such peaks would occur for an isolated flux transition. While the effects of peak shift can be minimized; for example, by pulse slimming, encoding of user data and prewrite compensation, it remains a problem with peak detect disc drives that limits the transfer rate of data in such a disc drive.

Moreover, the superposition of magnetic fields of successive flux transitions gives rise to a second problem. The fields produced by adjacent flux transitions superpose destructively so that the magnitude of the signal induced in a read head by passage of a flux transition decreases with increasing transfer rate. Consequently, the signal to noise ratio of the output of the read head decreases with increasing transfer rate to increase the number of errors that occur during the reading of data. While, as in the case of peak shift, corrective measures; for example, adaptive signal filtering and the use of error detection and correction circuitry, can be taken, it becomes increasingly difficult to employ these measures as the transfer rate is increased. The net result is that, while room for improvement of disc drives that make use of peak detection circuitry may still exist, the improvements are achieved only by measures that are becoming increasingly difficult and expensive to employ.

Because of this difficulty in increasing the data transfer rate in disc drives employing peak detection in the read channel, practitioners have, in recent years, turned to the use of so-called PRML read channels in disc drives. In disc drives of this type, partial response signaling is utilized to control, rather than to suppress, intersymbol interference and the effect of noise is minimized by the use of maximum likelihood detection of the magnetization of sequences of segments of the data track. To this end, signals corresponding to individual flux transitions are filtered to a signal which, in the absence of noise, would have a nominal form and the signals are then sampled at times determined in relation to this nonfinal form for maximum likelihood detection in which each bit of encoded data is recovered in the context of the sequence of bits that were written to the disc to limit the effect of noise.

The use of partial response signaling and maximum likelihood detection in a disc drive places especially stringent requirements on filtering of the signal induced in the read head prior to maximum likelihood detection. While maximum likelihood detection limits the effect of random noise in the reading of a block of data from a disc, variances between the nominal form to which signals induced in the read head are ideally filtered and the actual filtered signal constitute systematic noise which can generate errors in the data that is eventually recovered from a data track. Consequently, electronic filtering of the signal induced in the read head plays an important role in the operation of a disc drive that makes use of PRML.

A complicating factor in the filtering of the signal induced in a disc drive read head to a nominal form is that the form of the signal induced in the read head, even disregarding noise, varies with the radius of the data track upon which data being read is stored. Such variation, which is related to the increase of track circumference with track radius, arises from the use of the magnetic interaction between the read head and the magnetization of data track that enables the data track to be read and is, consequently, an inherent characteristic of signals induced in a read head. Thus, the filter in a PRML read channel must not only be capable of filtering the signal induced in a read head to a reasonable approximation of a specific wave form but must be able to do so adaptively in relation to track radius.

In the past, the favored approach to effecting the adaptive filtering required in a disc drive that employs partial response signaling and maximum likelihood detection has been to employ digital electronics in the construction of the filter. More particularly, the filter contains a digital to analog converter that digitizes the signal after partial filtering has taken place and a transversal equalizer that employs registers as delay elements so that filtering can be effected by adding successive sample values with appropriate weighting of the sample values. However, the use of digital electronics in the filter gives rise to another problem. Since clocked registers are used as delay elements, a delay is introduced between the times at which the signal is sampled and the time the filtered signal is received by circuitry used to time the taking of samples and the shifting of the registers in the filter. Further, since the operation of such circuitry is based on variances between actual sample values and sample values that are determined for specific sample moments referred to the nominal wave form, the delay introduced by the filter limits the extent to which a read clock, used to effect sampling and shifting of the registers in the equalizer, can be synchronized with the passage of flux transitions by the read head to cause the samples to be taken at sampling moments defined in relation to the nominal wave form. As a result, while the extent to which the filtered signal approximates the nominal wave form can be increased by increasing the number of delay elements, the added delay in the generation of the filtered signal that arises from the increase in delay elements increases errors in the times at which the wave form is sampled. Consequently, the use of digital filtering requires that compromises be effected between the extent to which the filtered signal approximates the nominal wave form and the appropriateness of the moments at which the filtered signal is sampled.

SUMMARY OF THE INVENTION

The present invention provides a fully adaptive filter system which can be employed to filter the signal induced in the read head of a disc drive to as close an approximation of the nominal wave form that is sampled for maximum likelihood detection as desired without introducing problems in the timing of the sampling of the filtered signal. Specifically, the filtering is completed before the signal is sampled so that circuitry that generates clock signals used in the sampling operates with substantially no delay between the generation of the samples and correction of any timing errors that may exist in the sampling. An example of such circuitry is described in U.S. Pat. No. 5,459,757, entitled "TIMING AND GAIN CONTROL CIRCUIT FOR A PRML READ CHANNEL", issued Oct. 17, 1995, to Minuhin et al., the teachings of which are hereby incorporated by reference, filed on even date herewith.

Moreover, the filter system of the present invention provides a flexibility in construction that permits the invention to be readily adapted not only to disc drives that make use of various types of read heads, or different classes of partial response signaling, but also to disc drives that operate at various transfer rates or, indeed, at a plurality of transfer rates. Further, the filter system of the present invention can be implemented in circuitry that does not require close manufacturing tolerances to achieve economy of manufacture. Further economies of manufacture are achieved by utilizing a delay circuit which makes use of adaptive filters to provide delayed signals that can be weighted and added to effect final filtering to the nominal wave form. More particularly, the use of filters as delay elements limits filtering that is effected prior to the generation of the delayed signals and the adaptivity of the filters so used provides a flexibility in filtering of the signal induced in the read head that permits the number of filters to be minimized without loss of capability of the filter system to achieve an approximation of the nominal wave form for any data track radius and substantially any data transfer rate that will suffice for maximum likelihood detection of the filtered signal to recover data that has been stored to the disc drive.

To these ends, and in one aspect of the invention, the filter system of the present invention is comprised of an adaptive, analog prefilter having a response that varies continuously with the excitation of the prefilter in accordance with a transfer function that is determined by at least one adaptive parameter received by the prefilter in combination with an analog, adaptive transversal equalizer that makes use of serially connected analog filter sections as the delay circuit which is tapped for addition of weighted sums of delayed signals derived from the signal received by the transversal equalizer. By the use of analog circuitry to effect the filtering, the filtering is completed before sampling of the signal is effected so that no interplay between the filtering of the signal induced in the read head to the nominal wave form and the sampling of the wave form exists. Hence, no limit exists on the degree to which the filter of the present invention may be adapted in relation to the circumstances in which the filter is used. Thus, the filter may be adapted for use with various types of read heads and classes of partial response signaling or used at substantially any transfer rate at any track radius.

In a second aspect of the invention, the filter sections of the delay circuit of the transversal equalizer are adaptive filters which provide selectable delays to the signal received by the transversal equalizer. Hence, the delays can be optimized experimentally to limit not only the number of filter sections that are needed to achieve a wave form that is sufficiently close to the nominal wave form for effective maximum likelihood detection but, further, to limit complexity that might otherwise be required of the prefilter.

In yet a third aspect of the invention, the filter sections of the transversal equalizer are low pass filters which enables further simplification of the prefilter. More particularly, in a PRML system, it is contemplated that the spectrum of the filtered signal will have a cutoff frequency at half the sampling rate and the use of low pass filters as the filter sections of the transversal equalizer has the effect of increasing the order of low pass filtering that is effected by the filter system as a whole. Consequently, circuitry that might otherwise be directed toward low pass filtering of the signal induced in the read head can be eliminated or simplified.

An object of the present invention is to provide a filter system for a PRML read channel that operates independently of circuitry that generates timing signals for the read channel.

Another object of the invention is to provide a filter system for a PRML read channel that can be adapted to substantially any PRML read channel with which the filter system might be used.

Yet a further object of the invention is to provide a filter system for a PRML read channel that is economical to manufacture.

Still another object of the invention is to limit the complexity of filter systems utilized in PRML read channels.

Other objects, features and advantages of the present invention will become apparent from the following detailed description when read in conjunction with the drawings and appended claims.

BRIEF DESCRIPTION OF THE DRAWINGS

FIG. 2 is a block diagram of the prefilter of the filter system shown in FIG. 1.

FIG. 3 is a block diagram of a stage of the prefilter shown in FIG. 2.

FIG. 4 is a graph comparing the spectrum of a typical signal issuing from the read head of a disc drive for an isolated magnetization pulse to the spectrum of a class IV partial response signal.

FIG. 5 is a block diagram of the transversal equalizer of the filter system shown in FIG. 1.

DESCRIPTION OF THE PREFERRED EMBODIMENT

Figure 1:
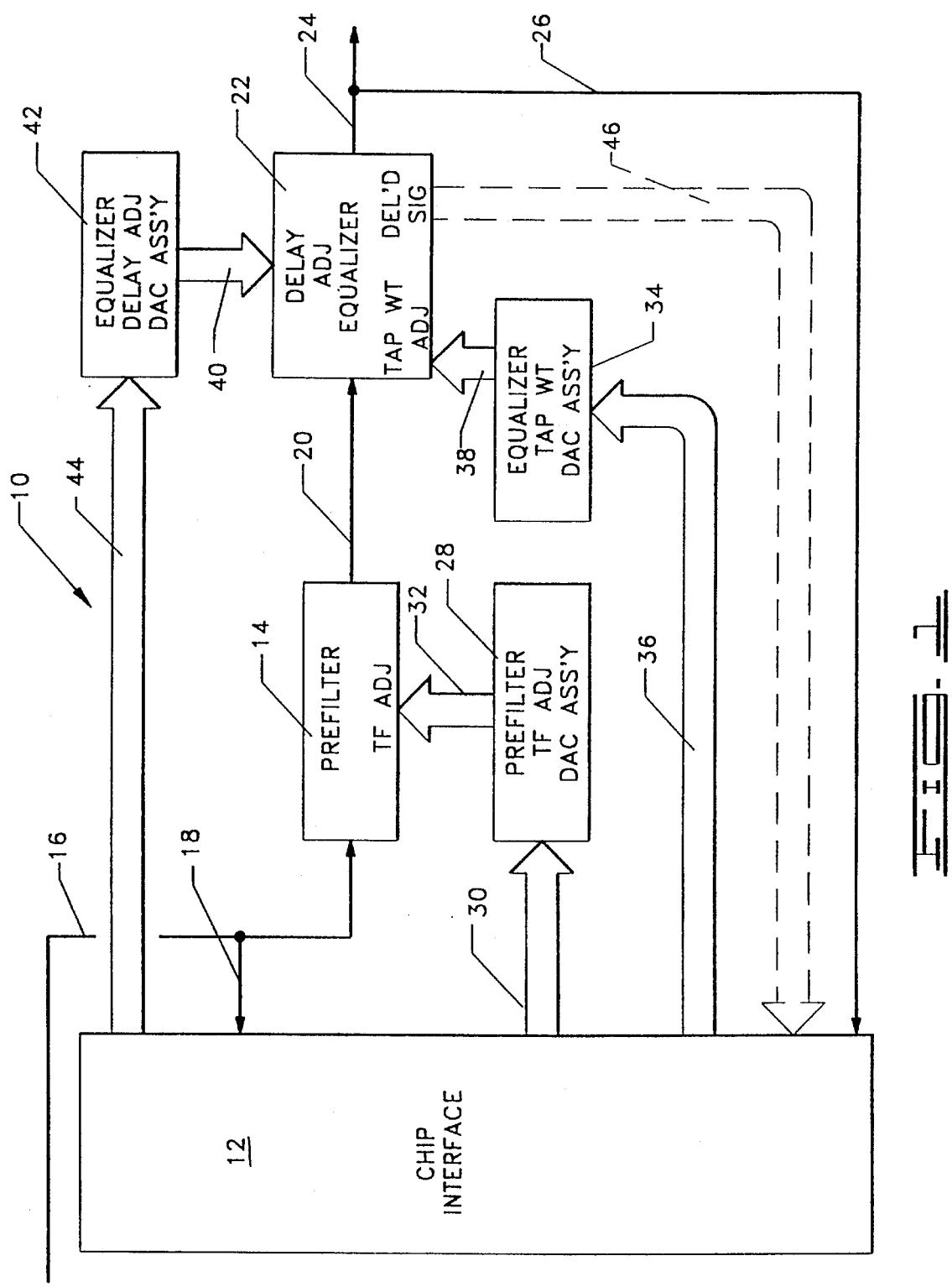
FIG. 1 is a block diagram of a filter system constructed in accordance with the present invention.

Referring now to the drawings in general and to FIG. 1 in particular, shown therein and designated by the general reference numeral 10 is a block diagram of a filter system constructed in accordance with the present invention. It is contemplated that the filter system 10 will be formed on a single silicon chip, with other portions of a PRML read channel (not shown), and will have adaptive features that will be described below. It is further contemplated that, in the implementation of these features, the filter system 10 will receive digitally expressed, adaptive parameters from a microprocessor (not shown) via a chip interface 12 which is comprised of a plurality of latches (not shown) for storing the parameters. These parameters will be discussed below.

Similarly, it is contemplated that the adaptation of the filter 10 will be carried out at the time that a disc drive employing the PRML read channel of which the filter system 10 is a part is manufactured and that such adaptation will include the measurement of signals at various locations on the filter system 10. Thus, the chip interface 12 will further include electrical connectors (not shown) to which external equipment can be connected for the measurement of these signals.

As shown in FIG. 1 the filter system 10 is generally comprised of an adaptive, analog prefilter 14 which receives the signal to be filtered on a signal path 16 from a variable gain amplifier (not shown) which is formed on the same chip as the filter system 10 and, like the filter system 10, is a portion of a PRML read channel for a disc drive. For purposes to be discussed below, the unfiltered signal on the signal path 16 is also provided to the chip interface 12, via a signal path 18, for transmittal to external equipment utilized in the adaptation of the filter system 10.

The output of the prefilter 14 is transmitted via a signal path 20 to the input of an analog, adaptive transversal equalizer 22 and the transversal equalizer 22 provides the filtered signal to samplers (not shown) which may be part of a timing and gain control circuit, as described in the previously incorporated Minuhin et al. reference U.S. Pat. No. 5,459,757, formed on the same chip via a signal path 24. The filtered signal is also transmitted to an electrical connector (not shown) in the chip interface 12 via a signal path 26 for a purpose to be described below.

As has been noted above, both the prefilter 14 and the transversal equalizer 22 are adaptive so that their filtering characteristics can be adjusted via adaptive parameters provided by a microprocessor. It is contemplated that these parameters will be expressed as analog signals at the prefilter 14 and transversal equalizer 22 and digital to analog converter assemblies are provided to convert the binary expressions of these parameters, by means of which they are stored in the microprocessor and outputted to latches in the chip interface 12, to analog parameter signals for use by the prefilter 14 and transversal equalizer 22.

In particular, the filter system 10 is comprised of a prefilter transfer function adjustment DAC assembly 28 which includes a plurality of digital to analog converters that receive binarily expressed adaptive parameters from the chip interface 12 via a bus 30 and output analog adaptive parameter signals that express the parameters to the prefilter 14 on signal paths that have been collectively indicated as a bus 32 in FIG. 1. For the preferred embodiment of the prefilter 14 to be discussed below, the adaptive parameter signals outputted by the DAC assembly 28 are electrical currents having magnitudes determined by binary values received by the prefilter 14. Similarly, digitally expressed tap weights are provided to a plurality of digital to analog converters (not shown) in an equalizer tap weight DAC assembly 34 on a bus 36 from the chip interface 12, converted to analog signals in the DAC assembly 34, and transmitted to the transversal equalizer 22 via a plurality of signal paths collectively indicated by an analog bus 38 in FIG. 1. As will be discussed below, the transversal equalizer 22 is comprised of a plurality of adaptive filter sections and analog signals used to adjust the characteristics of these filter sections are received by the transversal equalizer 22 on a plurality of signal paths collectively indicated as an analog bus 40 in FIG. 1 from an equalizer delay adjust DAC assembly 42. Digital expressions of these signals are provided to the DAC assembly 42 visa bus 44.

As will also be discussed below, the filter sections of the transversal equalizer 22 generate signals that are delayed in time with respect to signals these sections receive and these delayed signals can be transmitted to the chip interface 12 via a plurality of signal paths, collectively indicated as a bus 46 in FIG. 1, for measurement by off chip apparatus connected to the interface 12.

Referring now to FIGS. 2 and 3, shown therein is the construction of the prefilter 14 of the present invention. As shown in FIG. 2, the prefilter is comprised of a plurality of serially connected stages, three of which have been illustrated and designated by the numerals 48, 50 and 52 therein. In a preferred embodiment of the invention, adapted for use in a disc drive that employs class IV partial response signaling, a convenient number of stages for the prefilter 14 is five; however, it will be recognized by those of skill in the art that a different number of stages might be used. In particular, the present invention contemplates that the number of stages of the prefilter 14 and the construction of each stage can be varied to adapt the prefilter 14 to the disc drive in which the filter 10 is to be used. Thus, for example, the number of stages and the construction of each stage can be varied to take into account differences in the signals induced in read heads of different types that might be included in a disc drive or to adapt the prefilter 14 to the use of various classes of partial response signaling that might be used in a disc drive.

A preferred construction for selected ones of the stages of the prefilter 14 has been illustrated in FIG. 3 in which such stage has been designated by the general reference numeral 54. As shown therein, the stage 54 is comprised of a linear phase, analog, low pass filter 56 in one branch 58 of the stage 54 and a linear phase, analog, high pass filter 60 connected in series with a programmable gain amplifier 62 in a second branch 64 that is connected in parallel with the branch 58. The inputs of the filters 56 and 60 are connected together to receive the signal at the input of the stage 54 and the outputs of the low pass filter 56 and programmable gain amplifier 62 are added or subtracted by a summing circuit 66 to provide the response of the stage 54.

In the preferred embodiment of the prefilter 14 referred to above, the filters 56 and 60 of the first four stages of the prefilter 14 are second order filters having linear phase characteristics so that each of these stages can decrease the magnitude of the signal received by the prefilter 14 in a selected frequency range by addition of the outputs of the low pass filter 56 and the programmable gain amplifier 62 or can increase the magnitude of such signal, again in a selected frequency range, by subtracting of the output of the programmable gain amplifier 62 from the output of the low pass filter 56 in such stages.

It is further contemplated that the low pass filter 56 and high pass filter 60 of each stage 54 are adaptive filters having transfer functions that can be adjusted in response to adaptive parameter signals received on analog buses 68 and 70, respectively, that form a part of the bus 32 of FIG. 1. Filters having this capability have been described in the article: "Active Filter Design Using Operational Transconductance Amplifiers; A Tutorial", R. L. Geiger and E. Sanchez-Sinencio, IEEE Circuits and Devices Magazine, Volume 1, Number 2, March 1985. As disclosed in such article, the gain of an operational transconductance amplifier can be adjusted by an electrical current received by the amplifier and such characteristics can be utilized to construct filters, a number of which are illustrated in the article, for which the coefficients of frequency in the transfer functions of such filters can be adjusted by currents supplied to the operational transconductance amplifiers.

The programmable gain amplifier 62, which can also be constructed using operational transconductance amplifiers, similarly receives at least one adaptive parameter signal on a signal path 72 that forms a portion of the bus 30 of FIG. 1, to adjust the relative amplitudes of signals within the pass bands of the filters 56 and 60. Consequently, portions of the spectrum of a signal received by a stage 54 can be enhanced or attenuated by amounts selected by the programmable gain amplifier 62.

The final stage of the preferred embodiment noted above is a first order, adaptive low pass filter whose transfer function can similarly be adjusted in response to a current received by such stage on a signal path 74 (FIG. 2) in response to an adaptive parameter outputted by a microprocessor to the prefilter transfer function DAC assembly 28 shown in FIG. 1. Consequently, the transfer function of the prefilter 14 can be adjusted by currents supplied to the stages of the prefilter 14 on analog buses indicated at 76 and 78 in FIG. 2 to adjust the transfer functions of high and low pass filters included in such stages, by currents supplied to stages of the prefilter 14 on analog signal paths indicated for two stages at 80 and 82 in FIG. 2 to adjust the relative amplitudes of the high and low frequency responses of these stages, and by a current supplied to the last stage via the analog signal path 74 to adjust the transfer function of the last stage of the prefilter 14.

The purpose of providing the prefilter 14 with adaptive characteristics can best be understood with respect to signal characteristics that have been illustrated in FIG. 4. Shown therein is a graph 84 of the magnitude characteristic of the signal induced in a typical thin film read head by passage of an isolated magnetization pulse on a data track by the read head as a function of frequency. In general, and as shown, such characteristic rises rapidly from zero at zero frequency and then drops generally toward zero at higher frequencies. By contrast, the use of partial response signaling in the read channel of a disc drive assumes that the spectrum of the signal arising from an isolated magnetization pulse; that is, the signal which is sampled, will have a specific form which depends upon the class of partial response signaling that is employed in the disc drive. For example, where class IV partial response signaling is used in a disc drive, the wave form that is to be sampled is required to have a form generally illustrated by the curve 86 in FIG. 4 in which T is the time between successive samples. For such class of signaling, it can be seen that the signal induced in the read head generally exhibits greater than desired magnitude characteristics at low frequencies and smaller than desired magnitude characteristics at higher frequencies. Moreover, the spectrum of the signal induced in the head includes high frequency components that extend beyond the cutoff frequency for class IV partial response signaling.

The purpose of the filter 10 is to process the signal issuing from the read head to as close an approximation of the wave form for the selected class of partial response signaling that is to be used in the read channel of a disc drive and the invention contemplates that such processing will be carried out in part by the prefilter 14. Specifically, it is contemplated that the prefilter 14 will generally provide a low frequency notch, a boost at higher frequencies and a large attenuation above the partial response signal cut off frequency to adjust the gross magnitude characteristics of the signal. The final shaping of the signal to a close approximation of the desired signal wave form is then carried out using the transversal equalizer 22 that has been more particularly illustrated in FIG. 5.

Referring to FIG. 5, the transversal equalizer 22 of the present invention is comprised of a delay circuit generally indicated at 90 that is comprised of a series of analog filter sections 92, 94, 96 and 98 that each provide a continuous response to a continuous excitation that, further, is delayed in time with respect to the excitation by an amount that depends upon the transfer function of each filter section. The delay circuit 90 is tapped at the input to the filter section 92, at the output of the filter section 98 and between each pair of filter sections 92, 94, 96 and 98 and the signals at the tap locations are transmitted to analog multipliers 100, 102, 104, 106 and 108 as illustrated in FIG. 5.

The gains of the multipliers 100, 102, 104, 106 and 108 are determinable by analog tap weight signals received on signal paths 110, 112, 114, 116 and 118 respectively, forming the bus 38 in FIG. 1, so that the responses of the multipliers 100, 102, 104, 106 and 108 are signals having amplitudes that are multiples of signals at the tap locations and the tap weights received from a microprocessor via the chip interface 12 and the equalizer tap weight DAC assembly 34. The multipliers 100, 102, 104, 106 and 108 are preferably constructed using operational transconductance amplifiers as described above for the variable gain amplifiers 64 of the prefilter stages. In such case, the tap weights expressed digitally in the chip interface 12 will be converted to analog signals by the transversal equalizer tap weight DAC assembly 34 of FIG. 1.

These outputs of the variable gain multipliers 100, 102, 104, 106 and 108 are received by an analog summing circuit 120 which provides the response of the filter 10 to the signal received from the read head (via a variable gain amplifier, not shown) on the signal path 16 of FIG. 1.

While the filter 10 as so far described provides a circuit for achieving the partial response signal wave form to be sampled in a disc drive for maximum likelihood detection, the filter 10 is comprised of additional features which are used to optimize the construction and capabilities of the filter 10. One such feature is the use of adaptive filters for the filter sections 92, 94, 96 and 98. More particularly, the present invention contemplates that the filter sections 92, 94, 96 and 98 may be constructed using operational transconductance amplifiers so that the transfer functions of the filter sections 92, 94, 96 and 98, can be adjusted in relation to currents received from the transversal equalizer delay adjust DAC assembly 42 via the analog bus 40 of FIG. 1 that has been carried into FIG. 5. As indicated by the use of a single bus, it is preferable that the filter sections 92, 94, 96 and 98 be simultaneously adjustable using a single DAC that provides signals to all of the filter sections 92, 94, 96, and 98 to limit the time required for determining the adaptive parameters used to adjust the filter 10. However, the invention contemplates that separate adjustment of the filters 92, 94, 96 and 98 can be effected. In particular, should the type of read head or choice of partial response signaling to be used in a disc drive make it advantageous to use separate adaptation of the filter sections 92, 94, 96 and 98, such separate adaptation can be readily effected utilizing the methods for selecting filter parameters that will be discussed below. Thus, in contrast to prior art transversal equalizers, delay times provided by the filter sections 92, 94, 96, and 98 are continuously variable to enable the composite signal at the output of the summing circuit 120 to be comprised of weighted sums of signals that are delayed by whatever times will yield the closest approximation to the nominal wave form to which signals induced in the read head are to be filtered. Additionally, the adaptivity of the filter sections 92, 94, 96 and 98 eliminates any requirement for exceptional manufacturing tolerances that might otherwise be necessary for the filter 10 to accomplish the results for which it is designed.

A second feature of the filter 10 in general, and the transversal equalizer 22 in particular, is that the filter sections are low pass filters; more specifically, sixth order low pass filters in the one preferred embodiment of the invention noted above. Thus, the filter sections 92, 94, 96 and 98 will contribute to the desired attenuation of high frequency components of the signal induced in the read head to minimize the requirements placed on the prefilter 14 to enable further economies in the manufacture of the filter 10.

An optional feature of the filter system 10 is the inclusion of electrical connectors in the chip interface 12 providing access to the tap locations of the transversal equalizer 22. If such feature is used, the access is provided by signal paths 130, 132, 134, 136 and 138, comprising the bus 46 in FIG. 1, that connect to the inputs of the multipliers 100, 102, 104, 106 and 108. Such feature has the advantage of expediting the determination of adaptive parameters for the filter system 10 but requires additional connections to the chip upon which the filter system 10 is formed. Accordingly, the determination of adaptive parameters for the case in which the access to the tap locations is not provided for external equipment will be discussed below in addition to the case in which access is provided.

DETERMINATION OF THE ADAPTIVE PARAMETERS

Before discussing the manner in which adaptive parameters are determined for adjusting the tap weights of the transversal equalizer 22 and the transfer functions of the stages of the prefilter 14 and the filter sections of the transversal equalizer 22, it will be useful to briefly discuss the use of the filter system 10 in a disc drive that includes a PRML read channel of which the filter system is a part. As noted above, the purpose of the filter system is to process the signal induced in a read head to a nominal wave form which can be sampled for maximum likelihood detection.

In the present invention, it is contemplated that the transfer rate may be varied across the disc surface employing methods that have been described in U.S. Pat. No. 4,799,112 issued Jan. 17, 1989 to Bremmer et al. and in U.S. Pat. No. 5,087,992 issued Feb. 11, 1992 to Dahandeh et al. to permit maximization of the capacity of data stored in a disc drive that makes use of the present invention. Consequently, the adaptive parameters are determined not only to adjust the filter system 10 to compensate for variations in the spectrum of the signal induced in the read head with data track radius but to enable the filter system 10 to be adjusted for the variation of transfer rate across the disc. Once the adaptive parameters are determined, they may be stored on special tracks on one or more discs of the disc drive for reading and subsequent use during start up of the disc drive.

The determination of the adaptive parameters is carried out at the time of manufacture of the disc drive by initially setting the parameters to default values which are determined theoretically and then adjusting the parameters to experimentally determine values for the parameters which will yield the closest fit of the signal issuing from the summing circuit 120 for passage of a magnetization pulse by the read head to the nominal form that is to be sampled for maximum likelihood detection. To this end, a plurality of randomly generated track magnetization pulses; that is, segments of a data track which are magnetized in a direction that is opposite the direction of magnetization of the data track to either side of the segment, are written to a selected data track at a selected transfer rate at which data might be subsequently written to the data track or read therefrom.

Conventional sampling circuitry that responds to a trigger pulse to measure a signal received by such circuitry is then connected to the chip interface 12 to receive the unfiltered signal inputted to the prefilter 14 on the signal path 16, via the signal path 18 of FIG. 1, and to receive the signal at the output of the transversal equalizer via the signal path 26. Such sampling circuitry is adjusted to respond to the unfiltered signal, used as a trigger, to repetitively sample the output of the transversal equalizer at a rate that is large in comparison to the transfer rate that has been selected for the initial determination of the adaptive parameters. Consequently, as magnetization pulses pass the read head, the sampling circuitry will generate a plurality of sample values of the filtered signal issuing from the filter system 10. The samples are provided to a digital computer which is programmed to determine a set of samples corresponding to passage of a single magnetization pulse using conventional statistical techniques.

In the preferred method for determining the values of the adaptive parameters, the experimentally determined single pulse sample values of and ideal sample values determined from the nominal wave form are used to define a signal to noise ratio that is maximized to select optimum values for selected ones of the adaptive parameters. More particularly, the signal to noise ratio is determined by summing the differences between the experimentally determined sample values and the ideal sample values, summing the ideal sample values and dividing the latter sum by the former sum.

Once the signal to noise ratio so defined has been determined, one adaptive parameter, which, for example, may be a parameter to be stored in the prefilter transfer function adjust DAC assembly 28 to determine the transfer function of a filter in a selected stage of the prefilter, is changed and the measurement is repeated to determine the signal to noise ratio for the new set of adaptive parameters. If the signal to noise ratio is increased, the adaptive parameter is again changed in the same direction for further measurement of the signal to noise ratio. If the signal to noise ratio is decreased, the adaptive parameter is changed in a direction opposite the original change for further measurement of the signal to noise ratio. Successive changes are then made to determine the value of the selected adaptive parameter that will yield the maximum signal to noise ratio. The same measurements are made for all of the adaptive parameters, other than the tap weights for the transversal equalizer 22, in turn to obtain a first order set of optimum adaptive parameters other than the tap weights.

The determination of a first order set of optimum values for the tap weights can efficiently be carried out using a least squares approach that will be discussed first for the case in which the chip interface 12 is provided with connectors that provide access to the tap locations of the delay circuit 90 via the signal paths 130, 132, 134, 136 and 138 in FIG. 5. In such case, sampling circuitry as described above is connected to the chip interface for each of the signal paths 130, 132, 134, 136 and 138 so that samples corresponding to the signals that would appear at each of the tap locations in response to the passage of a single magnetization pulse by the read head can be determined as described above. The first order set of optimum tap weights are then determined by successively selecting a set of single pulse samples, corresponding to coincident sample times for each of the tap locations, determining the optimum tap weights for that set of single pulse samples by minimizing the sum of the squares of the differences between the single pulse sample values and ideal sample values determined from the nominal wave form, and then selecting the tap weights for the set of single pulse samples that will yield the minimum sum of squares.

In the case in which the chip interlace 12 does not include connectors for each of the tap locations, the sets of samples utilized to determine the tap weights are obtained by successively setting all but one tap weight to zero, setting that tap weight to one, and sampling the output of the transversal equalizer 120 on the signal path 26.

Once a first order set of optimum adaptive parameters, including the tap weights, has been determined such set is utilized as default values for a repetition of the parameter determination procedure to find a second order set of optimum adaptive parameters. Further iterations are carried out until the optimum set of adaptive parameters determined in one execution of the procedure does not vary significantly from the optimum set Of adaptive parameters obtained in the previous iteration. The values of the adaptive parameters for the final iteration then determines the optimum values for the parameters at the data track for which the measurements are made.

The determination of the adaptive parameter values is repeated for other transfer rates that might be used in the writing of data to the selected data track and the entire procedure, including the use of a plurality of transfer rates, is repeated for a selection of data tracks to obtain optimum values at different transfer rates for a selection of data tracks across the disc. The method described in the aforementioned U.S. Pat. No. 5,087,992 is then used to determine transfer rates for radial zones of data tracks that will maximize the data storage capacity of the disc drive and the optimum adaptive parameters for the transfer rates of the zones are stored with the zone transfer rates for use when the disc drive is placed into service.

It will be clear that the present invention is well adapted to carry out the objects and attain the ends and advantages mentioned as well as those inherent therein. While a presently preferred embodiment has been described for purposes of this disclosure, numerous changes may be made which will readily suggest themselves to those skilled in the art and which are encompassed in the spirit of the invention disclosed and as defined in the appended claims.

What is claimed is:

1. A filter system for a communications channel, comprising:

prefilter adaptive parameter signal means for providing a prefilter adaptive parameter signal;

an adaptive, analog prefilter characterized in that the response of the prefilter varies continuously in relation to the excitation of the prefilter in accordance with a transfer function determined by the prefilter adaptive parameter signal;

filter section adaptive parameter signal means for providing a filter section adaptive parameter signal; and an analog, adaptive transversal equalizer connected to the prefilter to receive the response of the prefilter, wherein the transversal equalizer is comprised of:

a delay circuit comprising a plurality of serially connected analog filter sections, wherein each filter section is characterized as an adaptive filter section in that the response of the filter section varies continuously independently of the sampling rate in relation to the excitation of the filter section in accordance with the filter section adaptive parameter signal;

a plurality of analog multipliers connected to selected tap locations of the delay circuit, whereby the responses of the multipliers are signals having amplitudes that are multiples of the amplitudes of signals at said tap locations determined in relation to tap weight signals received by the multipliers; and analog summing means connected to the multipliers for adding the responses of the multipliers.

2. The filter system of claim 1 wherein the filter sections of the delay circuit are low pass filters.

3. The filter system of claim 2 wherein the filter sections of the delay circuit are filters of at least sixth order.

4. A filtering system for a communications channel, comprising:

prefilter adaptive parameter signal means for providing a prefilter adaptive parameter signal;

an adaptive, analog prefilter characterized in that the response of the prefilter varies continuously in relation to the excitation of the prefilter in accordance with a transfer function determined by the prefilter adaptive parameter signal;

filter section adaptive parameter signal means for providing a filter section adaptive parameter signal; and an analog, adaptive transversal equalizer connected to the prefilter to receive the response of the prefilter, wherein the transversal equalizer comprises:

a delay circuit comprising a plurality of serially connected analog frequency-domain filter sections, wherein each filter section is characterized as an adaptive filter section in that the response of the filter section varies continuously independently of the sampling rate in relation to the excitation of the filter section in accordance with the filler section adaptive parameter signal;

a plurality of analog multipliers connected to selected tap locations of the delay circuit, whereby the responses of the multipliers are signals having amplitudes that are multiples of the amplitudes of signals at said tap locations determined in relation to tap weight signals received by the multipliers; and analog summing means connected to the multipliers for adding the outputs of the multipliers.

5. The filtering system of claim 4, wherein the filter sections of the delay circuit are low pass filters.

6. The filtering system of claim 5, wherein the filter sections of the delay circuit are low pass with boost in the pass band.

* * * * *

UNITED STATES PATENT AND TRADEMARK OFFICE
CERTIFICATE OF CORRECTION

PATENT NO. : 5,592,340
DATED : January 7, 1997
INVENTOR(S) : Vadim B. Minuhin, Vladimir Kovner, and Srinivasan Surendran It is certified that error appears in the above-indentified patent and that said Letters Patent is hereby corrected as shown below:

Title page, under Abstract, line 4, delete "equator" and insert --equalizer--

Column 11, line 63, delete "Of" and insert --of--

Signed and Sealed this

Third Day of June, 1997

Attest:

BRUCE LEHMAN

Attesting Officer

Commissioner of Patents and Trademarks